(12) United States Patent
Malinin et al.

(10) Patent No.: US 11,736,022 B2
(45) Date of Patent: Aug. 22, 2023

(54) POWER SUPPLY AND WINDING SWITCH CONTROL VIA AN INTEGRATOR VOLTAGE

(71) Applicant: Infineon Technologies Austria AG, Villach (AT)

(72) Inventors: Andrey Malinin, Fort Collins, CO (US); Renato Bessegato, Oberhaching (DE); Yong Siang Teo, Singapore (SG)

(73) Assignee: Infineon Technologies Austria AG, Villach (AT)

( * ) Notice: Subject to any disclaimer, the term of this patent is extended or adjusted under 35 U.S.C. 154(b) by 119 days.

(21) Appl. No.: 16/941,890

(22) Filed: Jul. 29, 2020

(65) Prior Publication Data

US 2022/0038012 A1     Feb. 3, 2022

(51) Int. Cl.
| | |
|---|---|
| *H02M 3/335* | (2006.01) |
| *G01R 19/165* | (2006.01) |
| *H03K 5/24* | (2006.01) |
| *G05F 1/56* | (2006.01) |
| *G06G 7/18* | (2006.01) |
| *G01R 19/175* | (2006.01) |
| *H02M 1/00* | (2006.01) |

(52) U.S. Cl.
CPC .. *H02M 3/33515* (2013.01); *G01R 19/16528* (2013.01); *G01R 19/175* (2013.01); *G05F 1/561* (2013.01); *G06G 7/18* (2013.01); *H03K 5/24* (2013.01); *H02M 1/0025* (2021.05)

(58) Field of Classification Search
CPC ......... H02M 3/33542; H02M 3/33576; H02M 3/33523; H02M 3/33538; H02M 3/33569; H02M 3/33507; H02M 3/33592
See application file for complete search history.

(56) References Cited

U.S. PATENT DOCUMENTS

| | | | | |
|---|---|---|---|---|
| 5,237,222 A | * | 8/1993 | Koblitz ................ | H03K 5/2409 |
| | | | | 327/306 |
| 9,893,639 B1 | * | 2/2018 | Chen .................... | H02M 1/083 |
| 9,979,309 B1 | * | 5/2018 | Green .................... | H02M 1/08 |
| 10,063,159 B1 | * | 8/2018 | Kong ................... | H03K 5/1252 |
| 10,158,297 B1 | * | 12/2018 | Gong ................ | H02M 3/33592 |
| 10,224,828 B1 | * | 3/2019 | Sigamani .......... | H02M 3/33592 |
| 10,243,442 B1 | * | 3/2019 | Balakrishnan .... | H02M 3/33523 |
| 10,461,644 B1 | * | 10/2019 | Gong ................. | H02M 3/1582 |
| 10,644,604 B2 | * | 5/2020 | Wong ............... | H02M 3/33592 |

(Continued)

FOREIGN PATENT DOCUMENTS

WO    WO-2004112229 A1 * 12/2004  ....... H02M 3/33507

*Primary Examiner* — Thienvu V Tran
*Assistant Examiner* — Nusrat Quddus
(74) *Attorney, Agent, or Firm* — Armis IP Law, LLC

(57) ABSTRACT

A power supply includes a primary winding, a secondary winding, a switch, and a controller. The secondary winding is magnetically coupled to the primary winding. The switch is coupled to the secondary winding and controls a state of current through the secondary winding. The controller controls the state of the switch based on an integrator voltage derived from monitoring a voltage from the secondary winding. For example, the controller activates the switch to an ON state in response to detecting a condition in which the magnitude of the monitored voltage of the secondary winding crosses a threshold value such as a magnitude of an output voltage produced from the secondary winding.

29 Claims, 10 Drawing Sheets

(56) References Cited

U.S. PATENT DOCUMENTS

| | | | | |
|---|---|---|---|---|
| 10,840,817 | B1* | 11/2020 | Chopra | H02M 3/33592 |
| 11,088,626 | B2* | 8/2021 | Hayasaki | H02M 3/01 |
| 11,223,284 | B2* | 1/2022 | Xu | H02M 1/0048 |
| 11,303,217 | B2* | 4/2022 | Moon | H02M 1/088 |
| 11,349,405 | B2* | 5/2022 | Radic | H02M 3/33592 |
| 11,594,977 | B2* | 2/2023 | Malinin | G01R 19/16538 |
| 11,601,061 | B2* | 3/2023 | Kong | H02M 1/0058 |
| 2008/0037302 | A1* | 2/2008 | Yang | H02M 7/217 363/127 |
| 2008/0073974 | A1* | 3/2008 | Madigan | H02M 3/33561 307/31 |
| 2009/0003019 | A1* | 1/2009 | Yang | H02M 7/217 363/21.06 |
| 2010/0027298 | A1* | 2/2010 | Cohen | H02M 3/33592 363/21.14 |
| 2012/0300520 | A1* | 11/2012 | Ren | H02M 3/33592 363/127 |
| 2014/0003096 | A1* | 1/2014 | Deng | H02M 3/33592 363/21.14 |
| 2014/0078788 | A1* | 3/2014 | Yao | H02M 3/33592 363/21.14 |
| 2014/0112031 | A1* | 4/2014 | Chen | H02M 3/33523 363/21.14 |
| 2014/0204619 | A1* | 7/2014 | Telefus | H02M 3/33576 363/21.01 |
| 2014/0334205 | A1* | 11/2014 | Zhang | H05B 45/382 363/89 |
| 2015/0124494 | A1* | 5/2015 | Malinin | H02M 3/33592 363/21.14 |
| 2015/0222181 | A1* | 8/2015 | Coleman | H02M 3/156 323/288 |
| 2015/0280573 | A1* | 10/2015 | Gong | H02M 3/33592 363/21.14 |
| 2015/0280584 | A1* | 10/2015 | Gong | H02M 3/33592 363/21.13 |
| 2016/0006337 | A1* | 1/2016 | Thalheim | H03K 17/16 363/21.05 |
| 2016/0056704 | A1* | 2/2016 | Deboy | H02M 3/33523 363/21.13 |
| 2016/0111961 | A1* | 4/2016 | Balakrishnan | H02M 3/33507 363/21.12 |
| 2016/0126845 | A1* | 5/2016 | Cohen | H02M 3/33507 363/21.01 |
| 2016/0359421 | A1* | 12/2016 | Lin | H02M 1/08 |
| 2017/0117812 | A1* | 4/2017 | Furtner | H02M 3/33592 |
| 2017/0155335 | A1* | 6/2017 | Chang | H02M 1/36 |
| 2017/0250612 | A1* | 8/2017 | Malinin | H02M 3/33507 |
| 2017/0353099 | A1* | 12/2017 | Yang | H02M 1/08 |
| 2017/0358990 | A1* | 12/2017 | Papica | H02M 3/33523 |
| 2018/0226897 | A1* | 8/2018 | Kong | H02M 3/33592 |
| 2018/0294735 | A1* | 10/2018 | Song | H02M 1/083 |
| 2018/0367052 | A1* | 12/2018 | Gong | H02M 3/33592 |
| 2019/0006950 | A1* | 1/2019 | Kong | H02M 1/08 |
| 2019/0165686 | A1* | 5/2019 | Wang | H02M 3/33592 |
| 2019/0348920 | A1* | 11/2019 | Wong | H02M 3/33592 |
| 2019/0393797 | A1* | 12/2019 | Kong | H03K 5/1252 |
| 2020/0403519 | A1* | 12/2020 | Moon | H02M 3/33592 |
| 2021/0006172 | A1* | 1/2021 | Hu | H02M 1/08 |
| 2021/0242783 | A1* | 8/2021 | Xu | H02M 3/33538 |
| 2021/0249964 | A1* | 8/2021 | Kong | H02M 1/0058 |
| 2021/0257922 | A1* | 8/2021 | Bessegato | H02M 3/33523 |
| 2022/0052613 | A1* | 2/2022 | Xu | H02M 1/38 |
| 2022/0131474 | A1* | 4/2022 | Malinin | G05F 1/561 |
| 2022/0376629 | A1* | 11/2022 | Xu | H02M 3/33523 |

\* cited by examiner

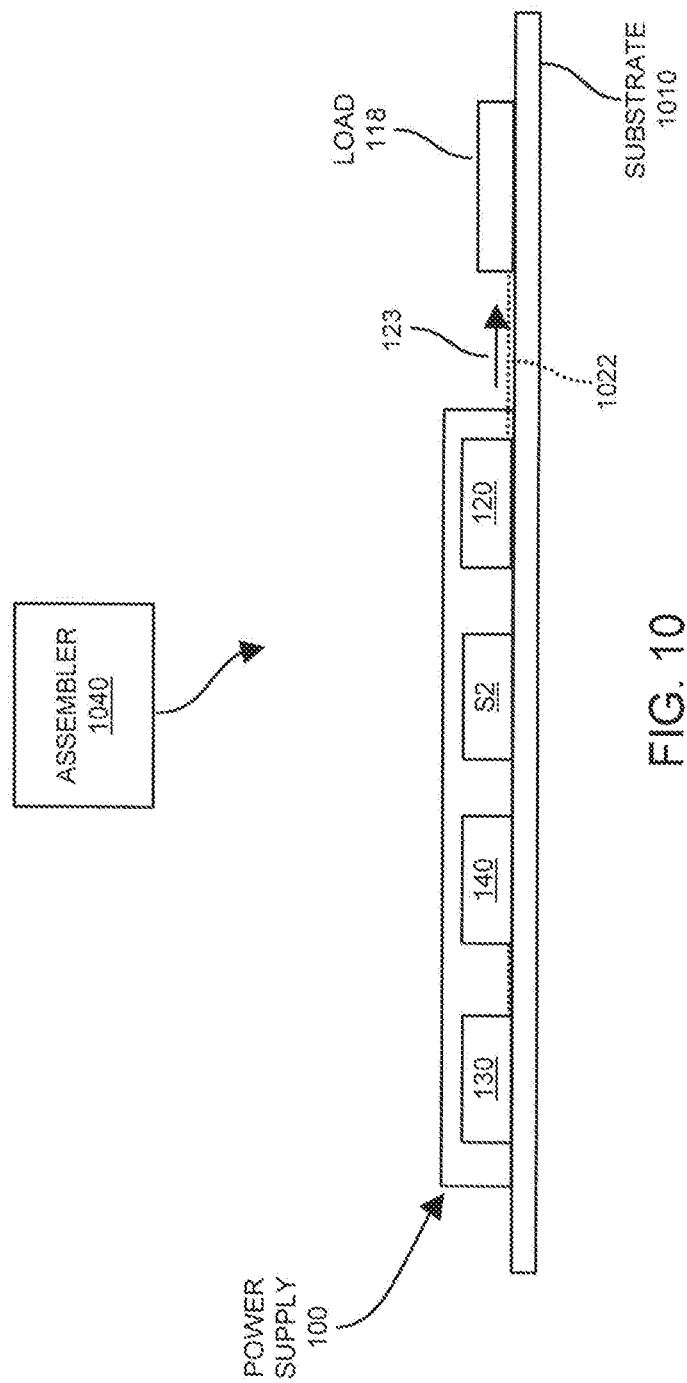

POWER SUPPLY AND WINDING SWITCH CONTROL VIA AN INTEGRATOR VOLTAGE

BACKGROUND

In today market, there are predominantly 2 types of Synchronous Rectification (SR) Techniques. Such techniques include a direct sensing method and voltage balance method. Regardless of which method used for SR operation, it is desirable to turn ON a respective SR Power FET (Field Effect Transistor) as soon as the system enters in a respective demagnetization phase.

However, when the system fully demagnetizes, there will be resonant ringing with respect to the voltage produced by a winding of the power supply. Such ringing may cause an improper trigger event of turning on a respective secondary winding switch during a power delivery cycle. In other words, the ringing present on the winding voltage prevents it from being used to detect a trigger condition.

BRIEF DESCRIPTION

This disclosure includes novel ways of providing improved performance of a voltage converter that generates a corresponding output voltage to power a load.

More specifically, according to embodiments herein, a power supply includes a primary winding, a secondary winding, a switch, and a (power supply) controller. The secondary winding is magnetically coupled to the primary winding. The switch is coupled to the secondary winding. The power supply controller: i) monitors a voltage of the secondary winding magnetically coupled to the primary winding, ii) derives an integrator voltage based on the monitored voltage from the secondary winding; and iii) controls the state of the switch based at least in part on the integrator voltage derived from monitoring a voltage from the secondary winding. For example, in one embodiment, based on the integrator voltage, the controller produces an enable window. During the enable window, the controller monitors the voltage from the secondary winding. The controller activates the switch to an ON state during the enable window in response to detecting a condition in which the magnitude of the monitored voltage of the secondary winding crosses a threshold value such as a magnitude of an output voltage produced from the secondary winding.

As described herein, the enable window derived from monitoring the voltage of the secondary winding prevents improper activation of the switch. More specifically, in one embodiment, the monitor voltage of the secondary winding repeatedly crosses a threshold value during a respective control cycle of producing the output voltage from the secondary winding to power a load. Detecting the enable window as well as enabling control of the switch during the enable window prevents improper activation of the switch at undesirable times during the control cycle.

In other words, certain embodiments herein include preventing activation of the switch outside of the enable window. Thus, the window provides a way to filter trigger events that would cause activation of the switch.

In accordance with further example embodiments, the monitored voltage from the secondary winding is received from a node associated with the secondary winding coupling the switch and the secondary winding. Thus, embodiments herein include monitoring a corresponding winding voltage of the node connecting the switch and the secondary winding.

The voltage of the secondary winding and generation of the integrator voltage can be achieved in any suitable manner. In one embodiment, the controller includes a voltage-to-current converter. The voltage-to-current converter supplies current to a capacitor that produces (stores) the integrator voltage.

In one embodiment, the current supplied to the capacitor is proportional to a difference between the monitored voltage from the secondary winding and an output voltage produced by the secondary winding.

Yet further example embodiments herein include, via the integrator, producing the integrator voltage based on integrating a difference between the monitored voltage from the secondary winding and the output voltage produced by the secondary winding.

Still further example embodiments herein include resetting the integrator voltage generated by the monitor in response to detecting one or more conditions. For example, embodiments herein include resetting the integrator voltage during: i) a resonant condition in which a magnitude of a voltage at the node is less than an output voltage produced by the secondary winding, ii) a diode conduction condition, etc.

In accordance with further example embodiments, the switch controlling coupled to the secondary winding is a first switch (secondary side switch). Certain embodiments herein further include a second switch (primary side switch) controlling current through the primary winding. In one embodiment, in addition to controlling the first switch (secondary side switch) based on the integrator voltage, embodiments herein include controlling the second switch (primary side switch) and corresponding current to the primary winding. Accordingly, embodiments herein include using the integrator voltage to identify a state in which to enable activation of the secondary side switch.

Still further example embodiments herein include one or more comparators to produce an enable signal (window) as well as detect crossing of the monitor voltage with respect to a threshold value. For example, in one embodiment, via a first comparator, the monitor/controller compares the integrator voltage to a threshold value. Based upon the comparison, the controller generates an enable signal enabling activation of the switch during a window of time in which the integrator voltage is detected as being greater than the threshold voltage. Via a second comparator, the controller detects a trigger condition (such as a zero crossing condition associated with the monitored voltage of the switch) within the window of time. In response to detecting a zero crossing condition within the window of time, the controller activates the switch to an ON state.

In one embodiment, via output from the second comparator, the controller activates the switch associated with the secondary winding to an ON state within the window of time in response to detecting a condition in which a magnitude of the monitored voltage of the secondary winding crosses a magnitude of an output voltage (zero voltage crossing) produced from the secondary winding.

Embodiments herein are useful over conventional techniques. For example, conventional techniques are prone to improper activation of a secondary winding switch because the monitored voltage of the secondary winding repeatedly crosses a respective threshold value, potentially resulting in false switch triggering conditions. In contrast to conventional techniques, embodiments herein include an integrator that determines a specific window in a switching cycle to allow switching of the secondary winding switch at an appropriate time following activation of the primary side switch.

These and other more specific embodiments are disclosed in more detail below.

Note that in addition to potentially being implemented as an analog controller and corresponding analog circuitry/components as described herein, embodiments herein include implementing the described circuitry via digital controller/monitor implementations. More specifically, note that any of the resources as discussed herein can include digital circuitry such as one or more computerized devices, apparatus, hardware, etc., that execute and/or support any or all of the method operations disclosed herein. In other words, one or more computerized devices or processors can be programmed and/or configured to operate as explained herein to carry out the different embodiments as described herein.

Yet other embodiments herein include software programs to perform the steps and/or operations summarized above and disclosed in detail below. One such embodiment comprises a computer program product including a non-transitory computer-readable storage medium (i.e., any computer readable hardware storage medium) on which software instructions are encoded for subsequent execution. The instructions, when executed in a computerized device (hardware) having a processor, program and/or cause the processor (hardware) to perform the operations disclosed herein. Such arrangements are typically provided as software, code, instructions, and/or other data (e.g., data structures) arranged or encoded on a non-transitory computer readable storage medium such as an optical medium (e.g., CD-ROM), floppy disk, hard disk, memory stick, memory device, etc., or other a medium such as firmware in one or more ROM, RAM, PROM, etc., or as an Application Specific Integrated Circuit (ASIC), etc. The software or firmware or other such configurations can be installed onto a computerized device to cause the computerized device to perform the techniques explained herein.

Accordingly, embodiments herein are directed to a method, system, computer program product, etc., that supports operations as discussed herein.

One embodiment includes a computer readable storage medium and/or system having instructions stored thereon to facilitate generation of an output voltage to power a load. The instructions, when executed by computer processor hardware, cause the computer processor hardware to: monitor a voltage of the secondary winding; derive an integrator voltage based on the monitored voltage from the secondary winding; and control an operational state of the switch based on the integrator voltage.

The ordering of the operations above has been added for clarity sake. Note that any of the processing steps as discussed herein can be performed in any suitable order.

Other embodiments of the present disclosure include software programs and/or respective hardware to perform any of the method embodiment steps and operations summarized above and disclosed in detail below.

It is to be understood that the system, method, apparatus, instructions on computer readable storage media, etc., as discussed herein also can be embodied strictly as a software program, firmware, as a hybrid of software, hardware and/or firmware, or as hardware alone such as within a processor (hardware or software), or within an operating system or a within a software application.

Note further that although embodiments as discussed herein are applicable to controlling switches in a power supply operable to generate an output voltage, the concepts disclosed herein may be advantageously applied to any other suitable voltage converter topologies.

Additionally, note that although each of the different features, techniques, configurations, etc., herein may be discussed in different places of this disclosure, it is intended, where suitable, that each of the concepts can optionally be executed independently of each other or in combination with each other. Accordingly, the one or more present inventions as described herein can be embodied and viewed in many different ways.

Also, note that this preliminary discussion of embodiments herein (BRIEF DESCRIPTION OF EMBODIMENTS) purposefully does not specify every embodiment and/or incrementally novel aspect of the present disclosure or claimed invention(s). Instead, this brief description only presents general embodiments and corresponding points of novelty over conventional techniques. For additional details and/or possible perspectives (permutations) of the invention(s), the reader is directed to the Detailed Description section (which is a summary of embodiments) and corresponding figures of the present disclosure as further discussed below.

BRIEF DESCRIPTION OF THE DRAWINGS

FIG. 10 is an example diagram illustrating fabrication of a respective power supply system and related circuitry according to embodiments herein.

Figure 1:
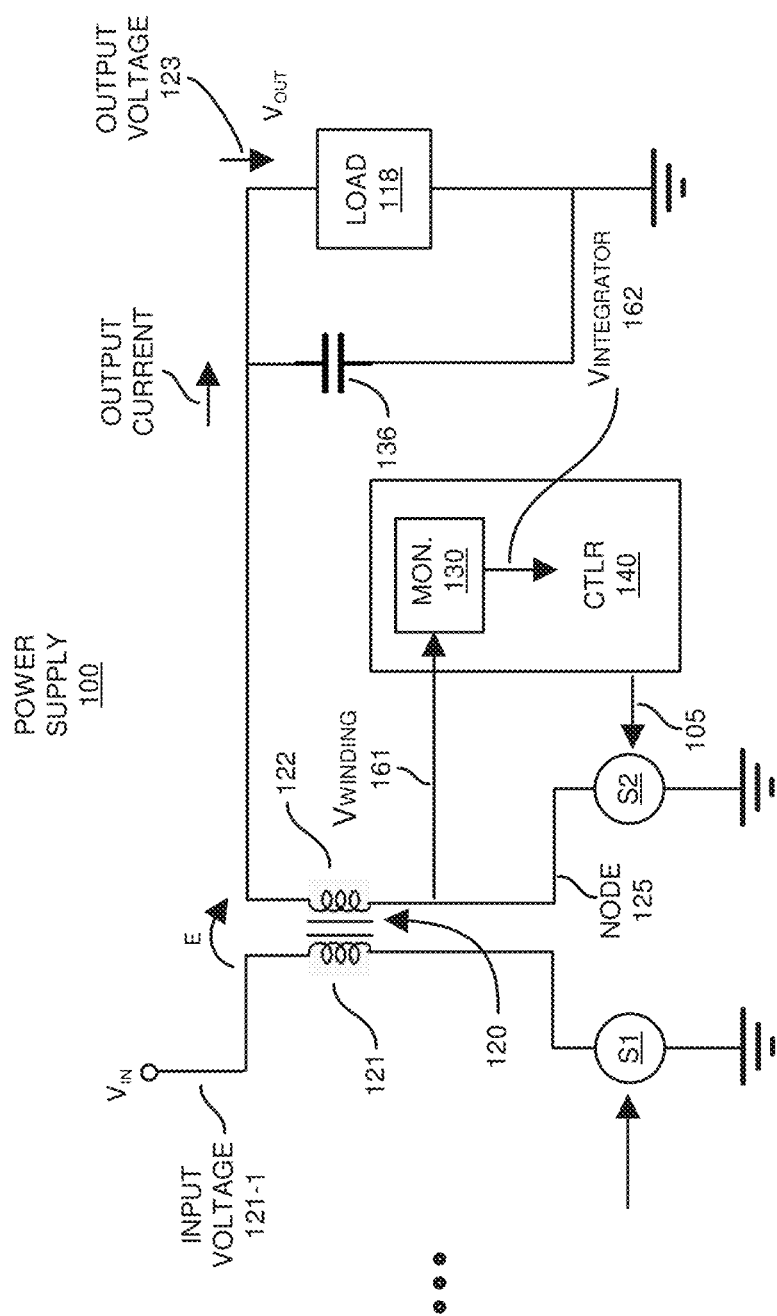
FIG. 1 is an example general diagram illustrating a power supply and switch control according to embodiments herein.

The foregoing and other objects, features, and advantages of embodiments herein will be apparent from the following more particular description herein, as illustrated in the accompanying drawings in which like reference characters refer to the same parts throughout the different views. The drawings are not necessarily to scale, with emphasis instead being placed upon illustrating the embodiments, principles, concepts, etc.

DETAILED DESCRIPTION

According to one embodiment, a power supply includes a primary winding, a secondary winding, a switch, and a controller. The secondary winding is magnetically coupled to the primary winding. The switch is coupled to the secondary winding. The controller controls the state of the switch based on an integrator voltage derived from monitoring a voltage from the secondary winding. For example, based on the integrator voltage, the controller produces an enable window. During the enable window, the controller activates the switch to an ON state in response to detecting a condition in which the magnitude of the monitored voltage of the secondary winding crosses a threshold value such as a magnitude of an output voltage produced from the secondary winding.

Now, more specifically, FIG. 1 is an example general diagram illustrating a power supply according to embodiments herein.

As shown in this example embodiment, power supply 100 (such as an apparatus, electronic device, etc.) includes transformer 120, switch S1, switch S2, monitor 130, controller 140, output capacitor 136, and load 118. Transformer 120 includes primary winding 121 and secondary winding 122.

In this example embodiment, the primary winding 121 is magnetically coupled to the secondary winding 122. Accordingly, a flow of current through the primary winding 121 causes the storage of corresponding magnetic energy, E, in the transformer 120. The secondary winding 122 uses the received energy from the primary winding to generate the output voltage 123. In one embodiment, current flows through an inherent diode (approximately a 0.7 volts drop) of the switch S2 (extending between source [anode of diode] and drain [cathode of diode]). However, activation of the switch S2 reduces the voltage difference between the drain and source nodes of switch S2, providing higher conversion efficiency.

The primary winding 121 and the switch S1 are coupled in series between the input voltage source, Vin, and a ground reference.

The secondary winding 122 and switch S2 are connected in series to produce a respective output voltage 123 that powers the load 118.

The monitor 130 monitors the voltage 161 at node 125 coupling the secondary winding 122 to the switch S2. Based on the monitoring, the monitor 130 produces voltage 162 (such as voltage Vintegrator) supplied to the controller 140 or used by the monitor 130 to generate a window signal.

The output capacitor 136 stores the output voltage 123.

In general, during operation, activation of the switch S1 via a respective controller function on the primary side (left of the winding 121) causes a flow of current from the input voltage source (Vin) through the primary winding 121 and the switch S1. Based upon the flow of current during a first portion of a control cycle, the primary winding 121 stores magnetic energy E in the transformer.

During a second portion of the control cycle, the controller 140 activates the switch S2. Activation of the switch S2 causes the secondary winding 122 to more efficiently convert the energy E received from the primary winding 121 into the output voltage 123 that powers the load 118.

As further shown, and as its name suggests, the monitor 130 monitors the voltage 161 associated with the node 125, which provides coupling between an axial end of the secondary winding 122 and the switch S2 such as a drain node of switch S2.

In one embodiment, the monitor 130 includes an integrator that derives the voltage 162 from the received voltage 161. Additional details of generating the integrator voltage 162 from the winding voltage 161 as further discussed below.

As further shown, the controller 140 controls the state of the switch S2 in a second portion of a respective control cycle based at least in part on the voltage 162 (such as an integrator voltage) derived from monitoring the voltage 161 from the secondary winding 122. As further discussed below, in one embodiment, based on the integrator voltage 162, the monitor 130 and/or controller 140 produces an enable window. During the enable window, the controller 140 monitors the voltage 161 and triggers the switch S2 to an ON state in response to detecting a condition in which the magnitude of the monitored voltage 161 of the secondary winding 122 crosses a threshold value such as a magnitude of the output voltage 123 produced from the secondary winding 123. In one embodiment, the control of the switch S2 provides desirable zero voltage switching.

Embodiments herein are useful over conventional techniques. For example, conventional techniques are prone to improper activation of a secondary winding switch such as S2 because the monitored voltage of the secondary winding repeatedly crosses a respective threshold value, resulting in false switch triggering conditions. In contrast to conventional techniques, embodiments herein include monitor 130 that, via an integrator function, determines a specific window in a switching cycle in which to allow switching the switch S2 to an ON state.

Figure 2:
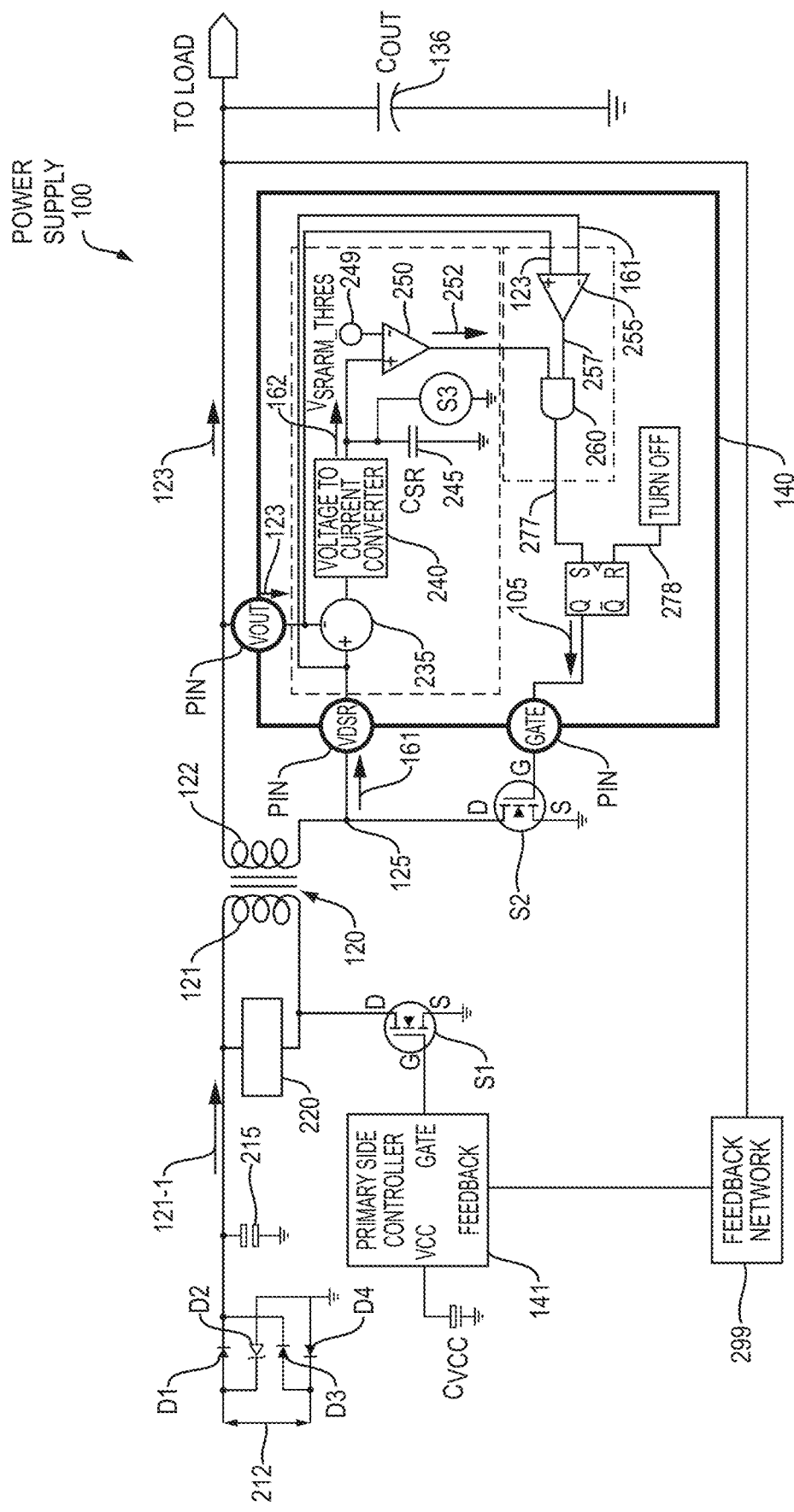
FIG. 2 is a more detailed example diagram illustrating a power supply and switch control according to embodiments herein.

FIG. 2 is a more detailed example diagram illustrating a power supply according to embodiments herein.

In this example embodiment, the power supply 100 includes rectifier 210, capacitor 215, snubber circuit 220, transformer 120, switch S1, primary site controller 141, feedback network 299, monitor 130, controller 140, and switch S2.

As previously discussed, the transformer 120 includes primary winding 121 and secondary winding 122. The secondary winding 122 is magnetically coupled to the primary winding 121.

During operation, the rectifier 210 receives AC input voltage 212. Rectifier 210 includes diode D1, diode D2, diode D3, diode D4.

Via the rectifier 210, the power supply 100 produces the input voltage 121-1 (a DC voltage or quasi-DC voltage). As further shown, the input voltage 121-1 is inputted to the winding 121 of transformer 120. Snubber circuit 220 reduces voltage spikes across the winding 121 as a result of switching.

In a first portion of a respective control cycle, the primary side controller 141 activates the switch S1 (such as a field effect transistor, bipolar junction transistor, etc.) for a duration of time to cause current to flow through the winding 121 in the switch S1 to a ground reference. While switch S1 is activated to an on state, the switch S2 is deactivated to an off state.

Activation of the switch S1 to the on state causes energy, E, to be stored in the primary winding 121, which is magnetically coupled to the secondary winding 122. In one embodiment, the primary site controller 141 controls operation of the switch S1 based on one or more feedback parameters such as a magnitude of the output voltage 123 as provided by the feedback network 299.

As further shown, the power supply 100 includes monitor 130 and controller 140. The combination of monitor 130 and controller 140 control operation of switch S2. For example, subsequent to temporarily activating the switch S1 to the ON state, the controller 140 temporarily activates the switch S2, providing a higher efficiency of converting energy, E, received from the primary winding 121 into the corresponding output voltage 123. In other words, the temporary activation of switch S2 in each of multiple respective control cycles as described herein results in more efficient conversion of the energy E from primary winding 121 into the output voltage 123.

As further shown, the decision in which to activate the switch S2 subsequent to temporarily activating the switch S1 is based upon the output voltage 123 as well as a respective voltage 161 associated with the winding 122. In one embodiment, during a respective control cycle, the magnitude of the voltage 161 associated with the winding 122 varies. Implementation of the monitor 130 enables the controller 140 to identify an appropriate window of time in which to monitor, via comparison, the output voltage 123 and the voltage 161 for a zero crossing condition.

As a more specific example, the monitor 130 includes the difference function 235, converter 240, capacitor 245, switch S3, and comparator 250.

In general, in this example embodiment, the monitor 130 produces a respective window signal 252, enabling the controller 140 to activate the switch S2 upon detecting the zero crossing condition. The window signal 252 is a logic high when a magnitude of the integrator voltage 162 is greater than the threshold voltage 249.

Thus, in one embodiment, monitored voltage 161 from the secondary winding 122 is received from a node 125 associated with the secondary winding 122 coupling the switch S2 and the secondary winding 122.

As further shown, the monitor 130 derives the window signal 252 based on the integrator voltage 162 stored in capacitor 245.

The window signal 252 can be generated in any suitable manner. In one embodiment, the monitor 130 produces the integrator voltage 162 based upon the voltage 161 and the output voltage 123.

More specifically, as its name suggests, the difference function 235 (such as summer, subtracted, etc.) produces signal 247 based on the difference between the magnitude of the winding voltage 161 and the output voltage 123. For example, in one embodiment, the difference function 235 subtracts the magnitude of the output voltage 123 from a magnitude of the voltage 161 to produce the signal 247 supplied to converter 240.

The converter 240 converts the signal 247 (such as a difference voltage as previously discussed) into a respective current that drives the capacitor 245 to produce the integrator voltage 162. A magnitude of the respective current outputted from the converter 240 is proportional to the difference between the magnitude of the voltage 161 and the magnitude of the output voltage 123. Thus, the voltage 162 stored in capacitor 245 increases as the switch S3 is deactivated (off state).

Accordingly, embodiments herein include, via the integrator functionality associated with monitor 130, producing the integrator voltage 162 based on integrating a difference between the monitored voltage 161 from the secondary winding 122 and the output voltage 123 produced by the secondary winding 122.

As further shown, the switch S3 controls discharge of the integrator voltage 162. The controller 140 and/or monitor 130 activates switch S3 at various times such as when the switch S1 and/or switch S2 are deactivated. Additional details are shown in the following timing diagram of FIG. 3.

Referring again to FIG. 2, the monitor 130 further includes a respective comparator 250. Based on a comparison of the integrator voltage 162 (stored in the capacitor 245) and the threshold value 249, the comparator 250 produces the window signal 252.

For example, when the magnitude of the integrator voltage 162 is greater than the threshold voltage 249, the comparator 250 produces the window signal to a high state (enable trigger condition state). Accordingly, embodiments herein include using the integrator voltage 162 to identify a state in which to enable activation the second switch S2.

As further shown, the controller 140 includes comparator 255 that controls activation of the switch S2.

In one embodiment, the comparator 255 associated with controller 140 compares the magnitude of the winding voltage 161 to the magnitude of the output voltage 123. Based on the comparison, the comparator 255 produces the corresponding signal 257.

For example, when the magnitude of the winding voltage 161 falls below the output voltage 123, the comparator 255 produces the signal 257 to be a logic high. In such an instance, assuming that the signal 252 is also a logic high (such as during the respective enable window), the AND gate 260 produces the signal 277 to be a logic high signal as well. This causes the set-reset flip-flop 265 to produce the control signal 105 in a high state, causing the switch S2 to turn on. After an appropriate amount time activating the switch S2 in a respective control cycle, the controller 140 resets the flip-flop 265 via signal 278. This causes the control signal 105 to go low and shut off corresponding switch S2.

Thus, embodiments herein include one or more comparators to produce an enable signal 252 (window) as well as detect crossing of the monitored voltage 161 with respect to a threshold value such as the output voltage 123. More specifically, in one embodiment, via a first comparator 250, the controller 140 and monitor 130 compares the integrator voltage 162 to a threshold value 249. Based upon the comparison, the comparator 250 generates an enable window signal 252 enabling activation of the switch S2 during a window of time in which the integrator voltage 162 is detected as being greater than the threshold voltage 249. Via a second comparator 255, the controller 140 detects a trigger condition (such as a zero crossing condition) within the window of time. In response to detecting a zero crossing condition within the window of time as indicated by the signal 257, the controller 140 activates the switch S2 in a manner as previously discussed.

Figure 3:
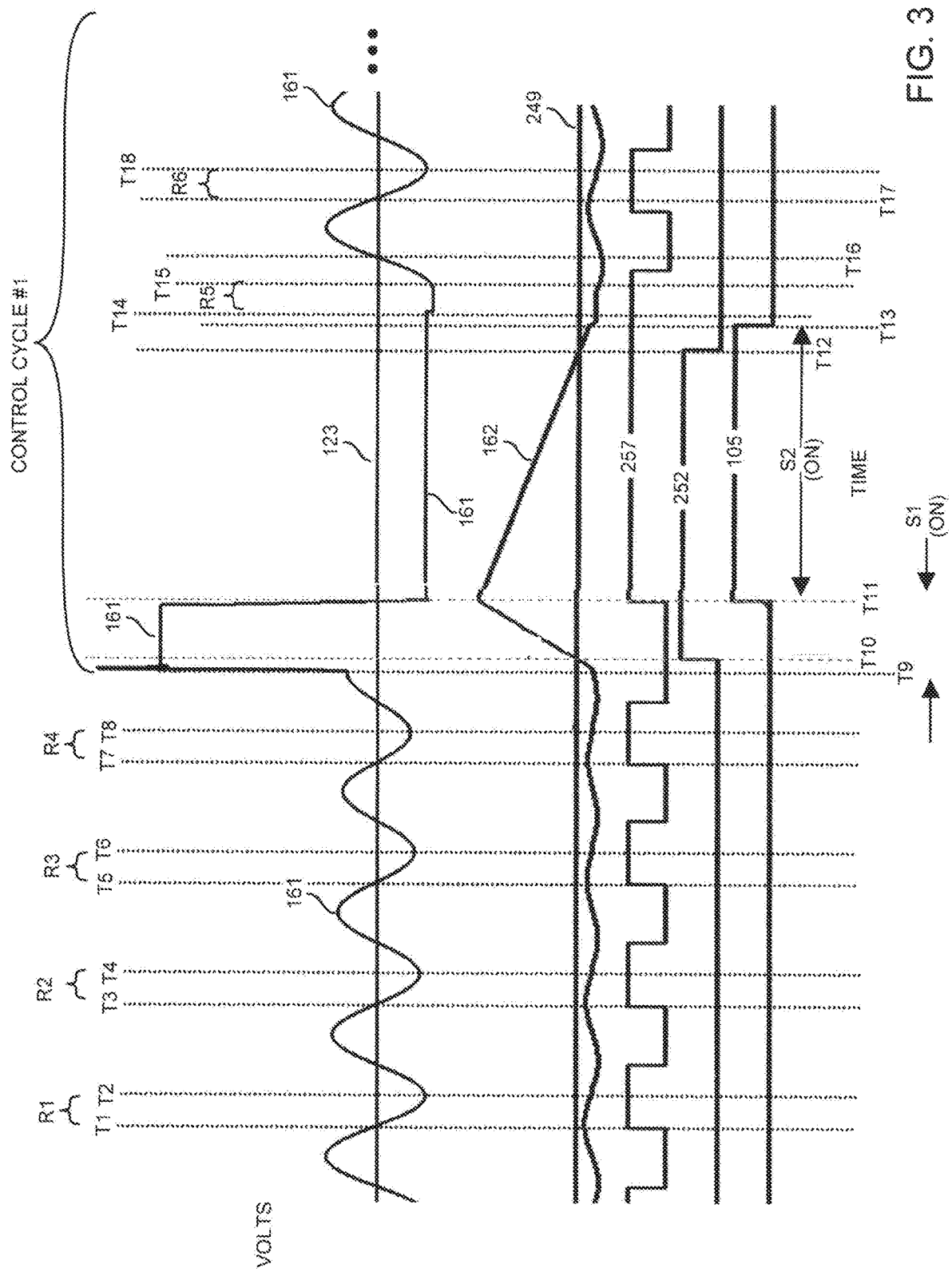
FIG. 3 is an example timing diagram of monitor and switch control signals according to embodiments herein.

FIG. 3 is an example timing diagram of signals according to embodiments herein.

Between time T1 and time T9, the reset signals R1, R2, R3, and R4 reset the voltage 162 on capacitor 245 via activation of switch S3. More specifically, the switch S3 is activated between time T1 and time T2 (reset duration R1); the switch S3 is activated between time T3 and time T4 (reset duration R2); the switch S3 is activated between time T5 and time T6 (reset duration R3); the switch S3 is activated between time T7 and time T8 (reset duration R4). As previously discussed, activation of the switch S3 prevents the integrator voltage 162 from rising above the threshold value 249.

Still further example embodiments herein include resetting the integrator voltage 162 on capacitor 245 in response to detecting one or more conditions. For example, embodiments herein include resetting the integrator voltage 162 during: i) resonant conditions in which a magnitude of the voltage 161 at the node 125 is less than an output voltage 123 produced by the secondary winding 122, ii) a diode conduction condition, etc.

Between time T9 and time T11, the switch S1 is activated to cause current to flow through the primary winding 121. In such an instance, the magnitude of the integrator voltage 162 increases monotonically between time T9 and T11. At time T10, the magnitude of the integrator voltage 162 is greater than the threshold value 249. This causes the window signal 252 to be set to a logic high state.

At or about time T11, the switch S1 is deactivated. Embodiments herein include activating switch S2 soon after or at the occurrence of the zero crossing of the voltage 161 with respect to the output voltage 123. Thus, in one embodiment, there is a small delay between the activation of the switch S1 and activation of the switch S2. The quick transition results in no diode conduction.

Also at or about time T11, because the window signal 252 outputted from the comparator 250 is already a logic high, the first input to the AND gate 260 is set to a logic high.

As previously discussed, the comparator 255 controls the second input to the AND gate 260. Accordingly, the signal 277 does not go to a logic high state (turning on switch S2) until comparator 255 detects that the voltage 161 becomes less than the output voltage 123. At such time, the signal 257 goes to a logic high, causing the signal 277 to be set to a logic high, resulting in the output Q of the flip-flop 265 to drive the switch S2 to the ON state.

The controller 140 controls the signal 105 and corresponding switch S2 to the ON state between time T11 and time T13. At such time, as is expected, the integrator voltage 162 steadily declines. This completes the function of activating the first switch S1 between time T9 and time T11 and subsequently activating switch S2 between time T11 and time T13.

Between time T15 and the end of the respective control cycle, the voltage 161 of node 125 continues to oscillate (resonate) above and below the output voltage 123. However, as previously discussed, the voltage 162 on capacitor 245 is prevented from rising above the threshold value 249 because of reset duration R5 (between time T14 and time T15), reset duration R6 (between time T17 and time T18), etc.

In this manner, the integrator voltage 162 and generation of a corresponding window signal 252 between time T10 and T12 is used as a basis to enable and control which crossing of the voltage 161 with respect to the output voltage 123 (threshold value) is to be used as a basis to activate the switch S2.

As described herein, the enable window signal 252 derived from monitoring the voltage 161 of the secondary winding 122 prevents improper activation of the switch S2. More specifically, in one embodiment, the monitor voltage 161 of the secondary winding 122 repeatedly crosses the threshold value 249 during a respective control cycle of producing the output voltage 123 from the secondary winding 122 to power a load 118. Enabling control of the switch S2 during the enable window signal 252 (between T11 and T13) prevents improper activation of the switch S2 at undesirable times during the control cycle. In other words, as described herein, embodiments herein include preventing activation of the switch S3 outside of the enable window (T11 to T13).

Figure 4:
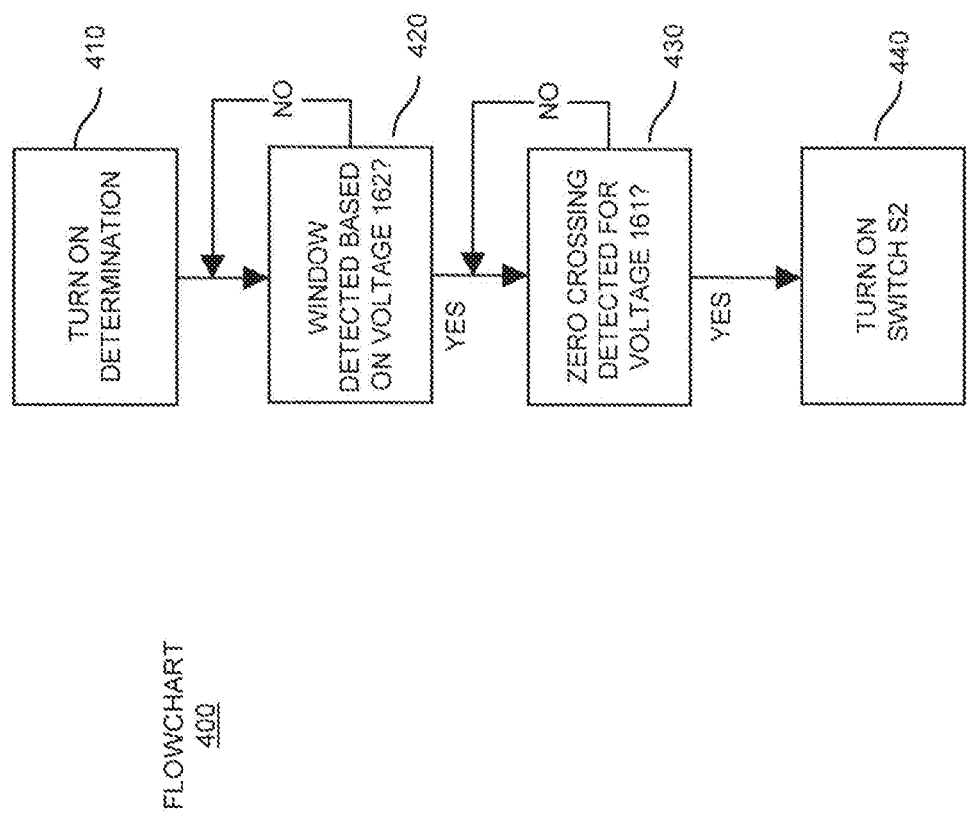
FIG. 4 is an example flow chart illustrating operation of a power supply according to embodiments herein.

FIG. 4 is an example flow chart illustrating operation of a power supply according to embodiments herein.

Flowchart 400 illustrates operations performed by the power supply to support zero voltage switching of the switch S2 in the secondary side of the power supply 100.

In operation 410, the controller 140 activates a function of monitoring the occurrence of activating the switch S1.

In operation 420, the monitor 130 monitors the voltage 161 to determine a window of time in which the integrator voltage 162 is above the threshold value 249. In one embodiment, as previously discussed, activation of the switch S1 causes the integrator voltage 162 to rise above the threshold value 249 and produce window enable signal 252.

In operation 430, during a condition in which the integrator voltage 162 is above the threshold value (such as during a respective window of time), the controller 140 compares the voltage 161 to the output voltage 123 to determine a corresponding zero voltage crossing condition associated with the voltage 161 at node 125 to activate the switch S2.

In operation 440, in response to detecting the zero voltage crossing condition associated with the voltage 161 during the window of time signal 252 as derived from the integrator voltage 162, the controller 140 activates the switch S2 to an ON state.

Figure 5:
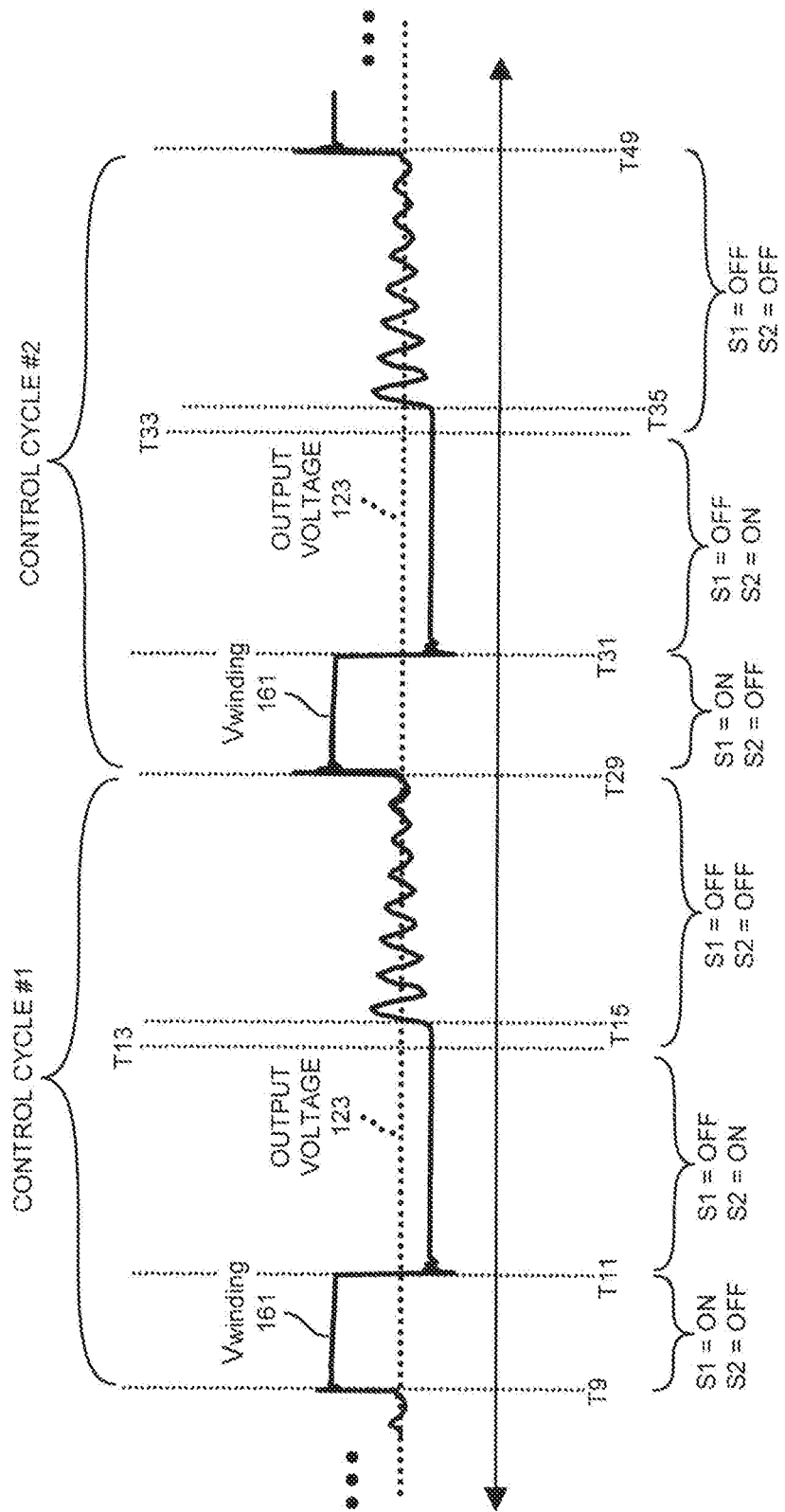
FIG. 5 is an example timing diagram illustrating multiple control cycles according to embodiments herein.

FIG. 5 is an example timing diagram illustrating multiple control cycles according to embodiments herein.

As shown in this example embodiment, the control cycle #1 occurs between time T9 and time T29.

The portion of the control cycle #1 between time T9 and T11 represents an approximate amount of time in which the switch S1 is activated to an ON state (during which switch S2 is deactivated to an off state). The time between T11 and time T13 represents an approximate amount of time in which the switch S2 is activated to the ON state (during which switch S1 is deactivated to an off state). The time between T15 and T29 represents a duration in which both switch S1 and switch S2 are deactivated to an OFF state and a magnitude of the voltage 161 varies in accordance with a respective resonance frequency.

As further shown in this example embodiment, the control cycle #2 occurs between time T29 and time T49.

The portion of the control cycle #2 between time T29 and T31 represents an approximate amount of time in which the switch S1 is activated to an ON state (during which switch S2 is deactivated to an off state). The time between T31 and time T33 represents an approximate amount of time in which the switch S2 is activated to the ON state (during which switch S1 is deactivated to an off state). The time between T35 and T49 represents a duration in which both switch S1 and switch S2 are deactivated to an OFF state and a magnitude of the voltage 161 varies in accordance with a respective resonance frequency.

In a similar manner as previously discussed, the power supply 100 repeats the process of producing an enable window signal 252 and then initiating activation of the second switch S2 based on a detected zero crossing following soon after deactivation of the switch S1, avoiding cross conduction and delay.

Figure 6:
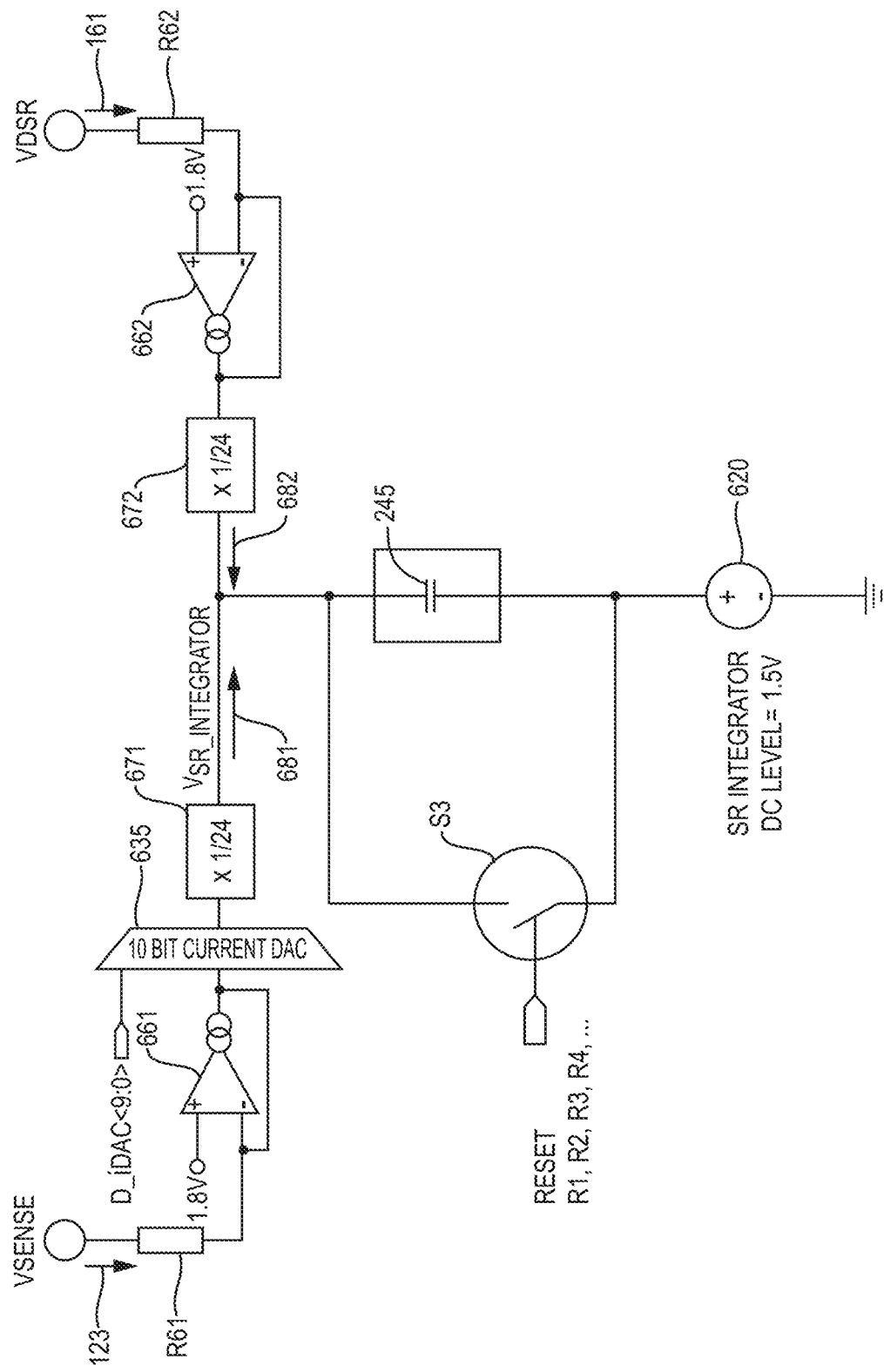
FIG. 6 is an example diagram illustrating an integrator according to embodiments herein.

FIG. 6 is an example diagram illustrating an integrator according to embodiments herein. In general, FIG. 6 illustrates the circuit concept of the Voltage Second Balance Integration.

In order to have good noise performance for VDSR pin (voltage 161), current sensing is used to sense the VDSR voltage. In one embodiment, this is achieved by clamping the VDSR pin to VCP_VDSR, which is 1.8V typically. This approach has an advantage of being able to sense positive and negative current. The same approach is also used to detect VSENSE (a.k.a., Vout) for better matching.

In this example embodiment, the implementation of the integrator circuitry including difference function 235, voltage to current converter 240, capacitor 245, and switch S3 is implemented as shown in FIG. 6.

For example, the combination of the difference function 235 and the voltage to current converter 240 is implemented via resistor R61, transconductance amplifier 661, digital to analog converter 635, gain stage 671, resistor R62, transconductance amplifier 662, and gain stage 672.

Resistor R61 sets the gain of transconductance amplifier 661. Resistor R62 sets a gain of transconductance amplifier 662.

During operation, the combination of resistor R61, transconductance amplifier 661, and gain stage 671 produces a respective current 681 proportional to the magnitude of the output voltage 123.

The combination of resistor R62, transconductance amplifier 662, and gain stage 672 produces a respective current 682 proportional to the magnitude of the voltage output voltage 123.

In a manner as previously discussed, the magnitude of the voltage 162 on the capacitor 245 is an integration of the difference in voltage 161 and the output voltage 123.

Note that, since it is difficult to ensure that the transconductance are matched ideally, embodiments herein include a RESET function applied to the switch S3 to ensure that the SR Integrator (voltage on capacitor 245) will start from the proper voltage when there is a PWM (Pulse Width Modulation) pulse. The capacitor 245 is reset via activation of switch S3. The reset signal applied to switch S3 is activated under the following conditions (R1, R2, R3, R4, R5, R6, etc.):

1. Diode Conduction Time at the end of Demagnetization
2. Before the generation of ZVS pulse
3. Rising Edge of the SR ZC Comparator (250)

Figure 7:
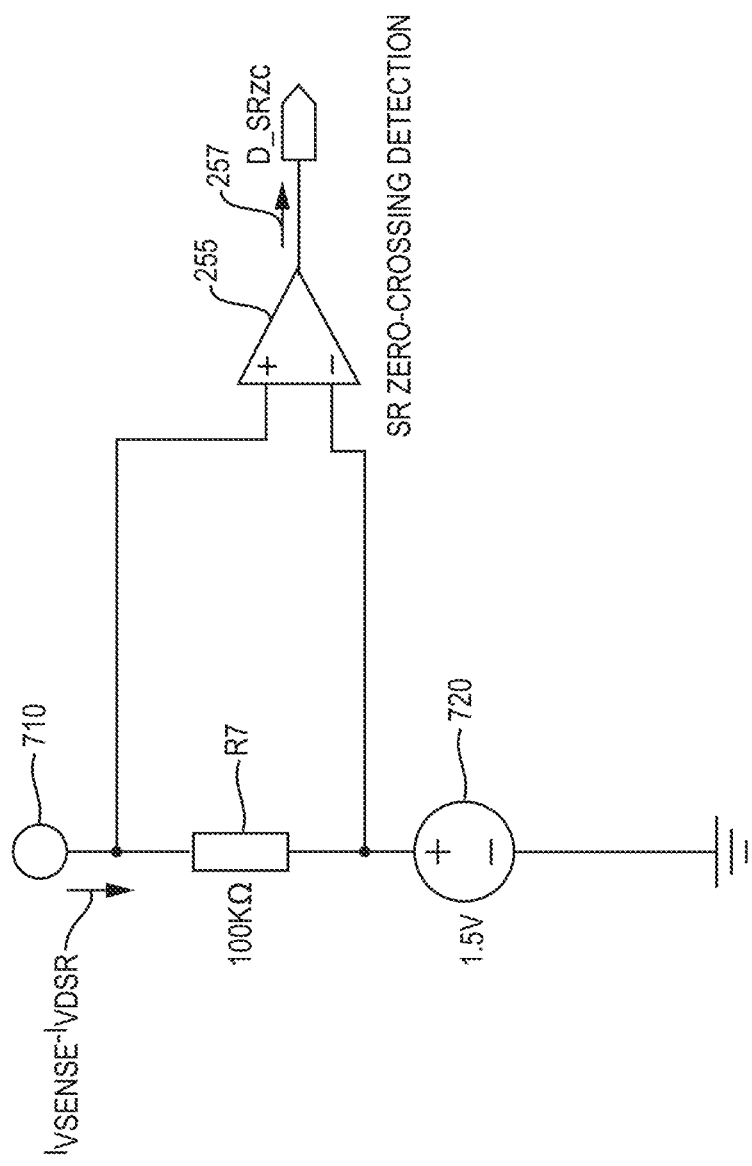
FIG. 7 is an example diagram illustrating zero crossing detector according to embodiments herein.

FIG. 7 is an example diagram illustrating zero crossing detection according to embodiments herein.

In this example embodiment, controller 140 includes a resistor R7, offset voltage source 720, and comparator 255. In such an instance, the sensed current from the VDSR pin (voltage 161) and VSENSE (a.k.a., VOUT or output voltage 123) pin is compared (such as via current of Vsense versus current of VDSR) internally as shown in FIG. 7.

In such an instance, the matching can be done internally. When the zero crossing occurs, IVDSR and IVSENSE are equal. Hence, there will be no voltage drop across the 100K resistor R7. In response to detecting the zero crossing in a manner as previously discussed, the signal 257 goes to a logic high.

Figure 8:
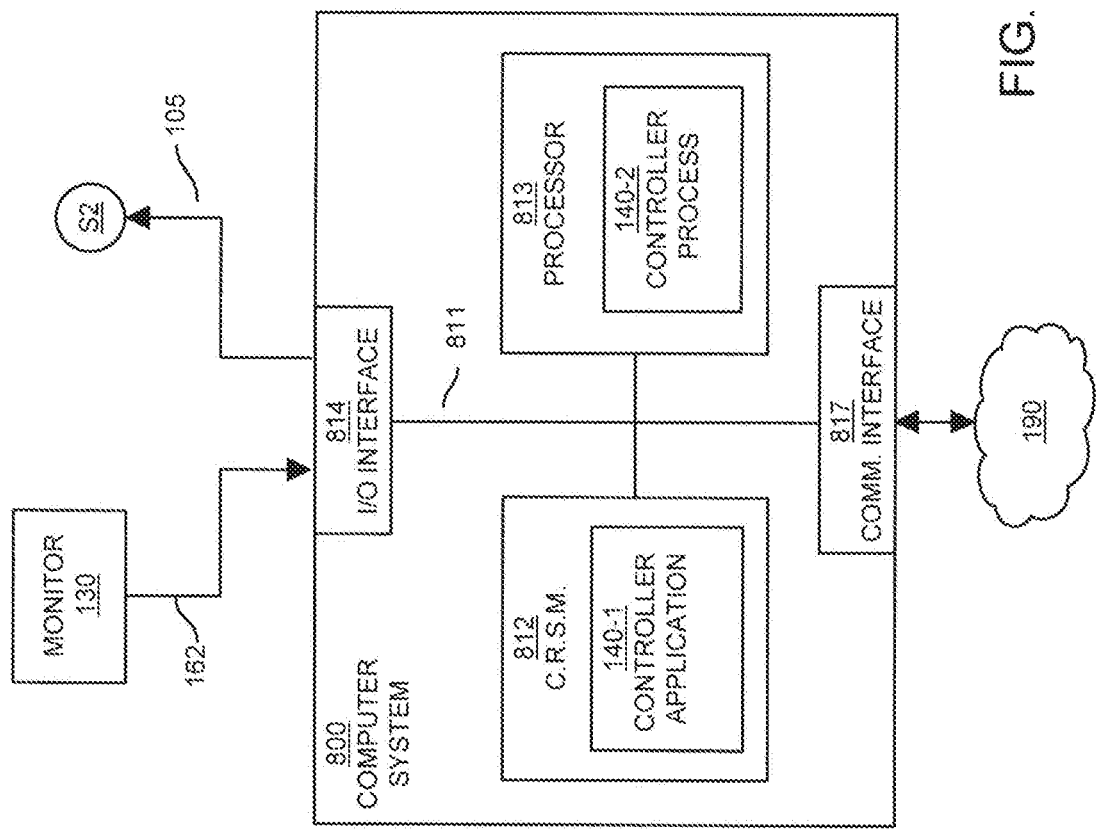
FIG. 8 is an example diagram illustrating computer architecture operable to execute one or more operations according to embodiments herein.

FIG. 8 is an example block diagram of a computer system for implementing any of the operations as previously discussed according to embodiments herein.

Any of the resources (such as controller 140, monitor 130, etc.) as discussed herein can be configured to include computer processor hardware and/or corresponding executable instructions to carry out the different operations as discussed herein.

For example, as shown, computer system 850 of the present example includes an interconnect 811 that couples computer readable storage media 812 such as a non-transitory type of media (which can be any suitable type of hardware storage medium in which digital information can be stored and retrieved), a processor 813 (computer processor hardware), I/O interface 814, and a communications interface 817.

I/O interface(s) 814 supports connectivity to voltage converter 110.

Computer readable storage medium 812 can be any hardware storage device such as memory, optical storage, hard drive, floppy disk, etc. In one embodiment, the computer readable storage medium 812 stores instructions and/or data.

As shown, computer readable storage media 812 can be encoded with controller application 140-1 (e.g., including instructions) to carry out any of the operations as discussed herein.

During operation of one embodiment, processor 813 accesses computer readable storage media 812 via the use of interconnect 811 in order to launch, run, execute, interpret or otherwise perform the instructions in controller application 140-1 stored on computer readable storage medium 812. Execution of the controller application 140-1 produces controller process 140-2 to carry out any of the operations and/or processes as discussed herein.

Those skilled in the art will understand that the computer system 850 can include other processes and/or software and hardware components, such as an operating system that controls allocation and use of hardware resources to execute controller application 140-1.

In accordance with different embodiments, note that computer system may reside in any of various types of devices, including, but not limited to, a power supply, switched-capacitor converter, power converter, a mobile computer, a personal computer system, a wireless device, a wireless access point, a base station, phone device, desktop computer, laptop, notebook, netbook computer, mainframe computer system, handheld computer, workstation, network computer, application server, storage device, a consumer electronics device such as a camera, camcorder, set top box, mobile device, video game console, handheld video game device, a peripheral device such as a switch, modem, router, set-top box, content management device, handheld remote control device, any type of computing or electronic device, etc. The computer system 850 may reside at any location or can be included in any suitable resource in any network environment to implement functionality as discussed herein.

Functionality supported by the different resources will now be discussed via flowchart in FIG. 9. Note that the steps in the flowchart below can be executed in any suitable order.

Figure 9:
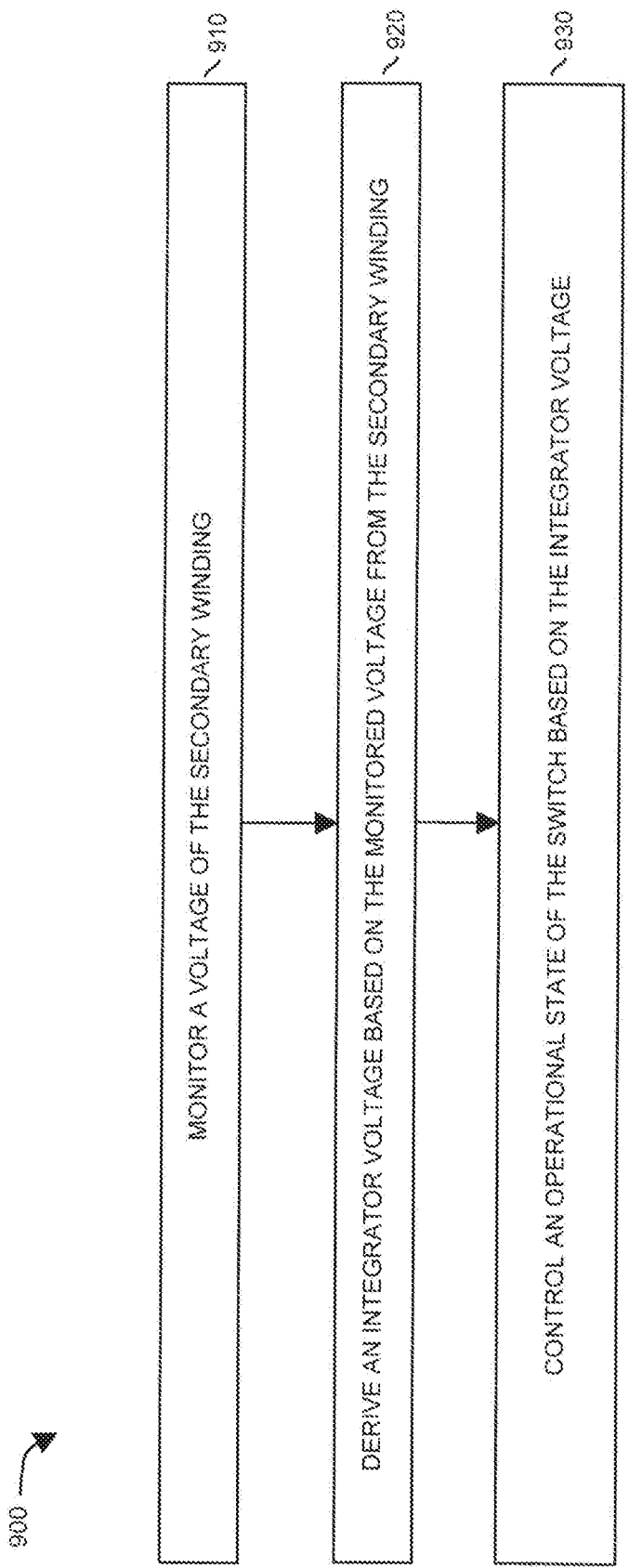
FIG. 9 is an example diagram illustrating a method according to embodiments herein.

FIG. 9 is a flowchart 900 illustrating an example method according to embodiments herein. Note that there will be some overlap with respect to concepts as discussed above.

In processing operation 910, the controller 140 (via the corresponding monitor 130) monitors a voltage 161 of the secondary winding 122.

In processing operation 920, via an integrator 245, the monitor 130 derives an integrator voltage 162 based on the monitored voltage 161 received from the secondary winding 122.

In processing operation 930, the controller 140 controls an operational state of the switch S2 based on the integrator voltage 161.

FIG. 10 is an example diagram illustrating assembly of a circuit board including a current monitor and controller according to embodiments herein.

In this example embodiment, assembler 1040 receives a substrate 1010 (such as a circuit board).

The assembler 1040 further affixes (couples) the components of power supply 100 (such as including monitor 130, controller 140, switch S2, transformer 120, etc.) to the substrate 1010.

Via one or more circuit paths 1022 (such as one or more traces, electrical conductors, cables, wires, etc.), the assembler 1040 or other suitable entity couples the power supply 100 to the load 118.

Note that components such as the transformer 120, monitor 130, controller 140, switch S2, etc., can be affixed or coupled to the substrate 1010 in any suitable manner. For example, one or more of the components in power supply 100 can be soldered to the substrate, inserted into one or more respective sockets on the substrate 1010, etc.

Note further that the substrate 1010 is optional. If desired, the components of power supply 100 and corresponding circuit paths can be disposed in cables or other suitable resource.

Via one or more circuit paths (such as one or more traces, cables, connectors, wires, conductors, electrically conductive paths, etc.), the assembler 1040 provides connectivity of the power supply 100 to the load 118. In one embodiment, the circuit paths 1022 convey the output voltage 123 from the power supply 100 to the load 118.

Accordingly, embodiments herein include a system comprising: a substrate 1010 (such as a circuit board, standalone board, mother board, standalone board destined to be coupled to a mother board, host, etc.); a power supply 100 including corresponding components as described herein; and a load 118. As previously discussed, the load 118 is powered based on conveyance of the output voltage 123 over one or more paths 1022.

Note again that techniques herein are well suited for use in power supply applications. However, it should be noted that embodiments herein are not limited to use in such applications and that the techniques discussed herein are well suited for other applications as well.

While this invention has been particularly shown and described with references to preferred embodiments thereof, it will be understood by those skilled in the art that various changes in form and details may be made therein without departing from the spirit and scope of the present application as defined by the appended claims. Such variations are intended to be covered by the scope of this present application. As such, the foregoing description of embodiments of the present application is not intended to be limiting. Rather, any limitations to the invention are presented in the following claims.

The invention claimed is:

1. An apparatus comprising:
   a power supply controller operative to:
   monitor a voltage of a secondary winding magnetically coupled to a primary winding, the secondary winding operative to receive energy from the primary winding;
   derive an integrator voltage based on the monitored voltage from the secondary winding;
   control an operational state of a first switch coupled to the secondary winding based on the integrator voltage; and
   wherein power supply controller is further operative to activate the first switch to an ON-state in response to detecting that a magnitude of the monitored voltage crosses a first threshold value during a window of time in which a magnitude of the integrator voltage is greater than a second threshold value.

2. The apparatus as in claim 1, wherein the monitored voltage from the secondary winding is received from a node associated with the secondary winding, the node coupling the first switch and the secondary winding.

3. The apparatus as in claim 1, wherein the power supply controller includes an integrator operative to produce the integrator voltage based on integrating a difference between the monitored voltage from the secondary winding and an output voltage produced by the secondary winding.

4. The apparatus as in claim 3, wherein the integrator voltage is a ramp voltage generated by the integrator based on the difference between the monitored voltage from the secondary winding and the output voltage produced by the secondary winding.

5. The apparatus as in claim 4, wherein the power supply controller is further operative to:
   via a comparator, compare the magnitude of the integrator voltage with a threshold voltage value to produce a compare signal, a state of the compare signal controlling operation of the first switch and current through the secondary winding.

6. The apparatus as in claim 1, wherein the power supply controller includes a voltage-to-current converter operative to supply current to a capacitor, the capacitor operative to store the integrator voltage, the supplied current being proportional to a difference between the monitored voltage from the secondary winding and an output voltage produced by the secondary winding.

7. The apparatus as in claim 1,
   wherein the power supply controller is further operative to use the integrator voltage to identify a state of activating a second switch controlling current through the primary winding.

8. The apparatus as in claim 1, wherein the power supply controller is further operative to:
   reset the integrator voltage when the integrator voltage is not used and release the reset when magnetizing current is expected to cross zero.

9. A system comprising:
   the power supply controller, the primary winding, and the secondary winding of claim 1.

10. The apparatus as in claim 1,
    wherein the magnitude of the integrator voltage increases above a threshold value in response to activation of a second switch to an ON-state, the second switch operative to control current through the primary winding.

11. The apparatus as in claim 10, wherein the magnitude of the integrator voltage decreases during deactivation of the second switch to an OFF-state and activation of the first switch to an ON-state.

12. The apparatus as in claim 1, wherein the first threshold value is an output voltage produced by the secondary winding.

13. The apparatus as in claim 1, wherein the magnitude of the integrator voltage increases during activation of a second switch to an ON-state while the first switch is deactivated to an OFF-state; and
    wherein the magnitude of the integrator voltage decreases during activation of the first switch to an ON-state while the second switch is deactivated to an OFF-state.

14. The apparatus as in claim 1, wherein the monitored voltage of the secondary winding repeatedly crosses the first threshold value outside the window of time during a respective control cycle of producing an output voltage from the secondary winding; and
    wherein the power supply controller is further operative to disable control of the first switch outside the window of time to prevent activation of the first switch during conditions in which the monitored voltage of the secondary winding repeatedly crosses the first threshold value outside the window of time.

15. The apparatus as in claim 1,
    wherein the power supply controller is further operative to determine an event of activation of a second switch to an ON-state based on the magnitude of the integrator voltage.

16. The apparatus as in claim 1, wherein the magnitude of the integrator voltage is an accumulated value derived from the monitored voltage.

17. An apparatus comprising:
a power supply controller operative to:
  monitor a voltage of a secondary winding magnetically coupled to a primary winding, the secondary winding operative to receive energy from the primary winding;
  derive an integrator voltage based on the monitored voltage from the secondary winding; and
  control an operational state of a switch coupled to the secondary winding, based on the integrator voltage,
  wherein the power supply controller includes a first comparator operative to compare the integrator voltage to a threshold value; and
  wherein the power supply controller is further operative to generate an enable signal enabling activation of the switch during a window of time, the window of time occurring during a condition in which the integrator voltage is detected as being greater than the threshold value.

18. The apparatus as in claim 17, wherein the power supply controller includes a second comparator operative to activate the switch to an ON state in response to detecting a zero crossing condition of the monitored voltage within the window of time.

19. The apparatus as in claim 17, wherein the power supply controller includes a second comparator operative to activate the switch to an ON state within the window of time in response to detecting a condition in which a magnitude of the monitored voltage crosses a magnitude of an output voltage produced from the secondary winding.

20. An apparatus comprising:
a power supply controller operative to:
  monitor a voltage of a secondary winding magnetically coupled to a primary winding, the secondary winding operative to receive energy from the primary windings;
  derive an integrator voltage based on the monitored voltage from the secondary winding;
  control an operational state of a switch coupled to the secondary winding based on the integrator voltage;
wherein the power supply controller is further operative to activate the switch to an ON state in response to detecting a condition in which a magnitude of the monitored voltage crosses a magnitude of an output voltage produced from the secondary winding.

21. A method comprising:
monitoring a voltage of a secondary winding magnetically coupled to a primary winding, the secondary winding receiving energy from the primary winding;
deriving an integrator voltage based on the monitored voltage from the secondary winding;
controlling an operational state of a switch based on the integrator voltage;
via a first comparator, comparing the integrator voltage to a threshold value; and
generating an enable signal enabling activation of the switch during a window of time in which the integrator voltage is detected as being greater than the threshold value.

22. The method as in claim 21 further comprising:
receiving the monitored voltage from a node associated with the secondary winding coupling the switch and the secondary winding.

23. The method as in claim 21 further comprising:
producing the integrator voltage based on integrating a difference between the monitored voltage from the secondary winding and an output voltage produced by the secondary winding.

24. The method as in claim 12 further comprising:
activating the switch to an ON state in response to detecting a zero crossing condition within the window of time.

25. The method as in claim 21 further comprising:
activating the switch to an ON state within the window of time in response to detecting a condition in which a magnitude of the monitored voltage crosses a magnitude of an output voltage produced from the secondary winding.

26. The method as in claim 21 further comprising:
via a voltage-to-current converter, supplying current to a capacitor, the capacitor operative to store the integrator voltage, the supplied current being proportional to a difference between the monitored voltage from the secondary winding and an output voltage produced by the secondary winding.

27. The method as in claim 21, wherein the switch is a first switch, the method further comprising:
via the integrator voltage, identifying a state of activating a second switch controlling current through the primary winding.

28. An apparatus comprising:
a power supply controller operative to:
  monitor a voltage of a secondary winding magnetically coupled to a primary winding, the secondary winding operative to receive energy from the primary winding;
  derive an integrator voltage based on the monitored voltage from the secondary winding;
  control an operational state of a first switch coupled to the secondary winding based on the integrator voltage;
  wherein the power supply controller is further operative to determine an event of activation of a second switch to an ON-state based on a magnitude of the integrator voltage; and
  wherein the power supply controller is operative to detect the activation of the second switch to the ON-state based on detecting that the magnitude of the integrator voltage is above a threshold value.

29. The apparatus as in claim 28, wherein the power supply controller is further operative to activate the first switch during a window of time following activation of the second switch, the activation of the second switch controlling a duration of the window of time.

* * * * *

UNITED STATES PATENT AND TRADEMARK OFFICE
CERTIFICATE OF CORRECTION

PATENT NO. : 11,736,022 B2
APPLICATION NO. : 16/941890
DATED : August 22, 2023
INVENTOR(S) : Andrey Malinin, Renato Bessegato and Yong Siang Teo It is certified that error appears in the above-identified patent and that said Letters Patent is hereby corrected as shown below:

In the Claims

Claim 1, Line 12, replace "wherein power" with --wherein the power--
Claim 17, Line 10, replace "winding," with --winding--
Claim 17, Line 10, replace "voltage," with --voltage;--
Claim 20, Line 6, replace "windings" with --winding--

Signed and Sealed this
Thirty-first Day of October, 2023

Katherine Kelly Vidal
*Director of the United States Patent and Trademark Office*